United States Patent
Chakravorty

(10) Patent No.: US 7,339,798 B2
(45) Date of Patent: *Mar. 4, 2008

(54) ELECTRONIC ASSEMBLIES AND SYSTEMS COMPRISING INTERPOSER WITH EMBEDDED CAPACITORS

(75) Inventor: Kishore K. Chakravorty, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/222,320

(22) Filed: Sep. 8, 2005

(65) Prior Publication Data

US 2006/0012966 A1    Jan. 19, 2006

Related U.S. Application Data

(63) Continuation of application No. 09/628,705, filed on Jul. 31, 2000, now Pat. No. 6,970,362.

(51) Int. Cl.
| | |
|---|---|
| H05K 7/00 | (2006.01) |
| H05K 7/06 | (2006.01) |
| H05K 7/08 | (2006.01) |
| H05K 7/10 | (2006.01) |

(52) U.S. Cl. ............... 361/782; 361/764; 361/765; 361/306.3

(58) Field of Classification Search ........ 361/760–766, 361/306.1–306.3; 174/259–263
See application file for complete search history.

(56) References Cited

U.S. PATENT DOCUMENTS

| | | | |
|---|---|---|---|
| 4,567,542 A | 1/1986 | Shimada et al. | |
| 4,926,241 A | 5/1990 | Carey | |
| 5,027,253 A | 6/1991 | Lauffer et al. | |
| 5,060,116 A | 10/1991 | Grobman et al. | |
| 5,177,594 A | 1/1993 | Chance et al. | |
| 5,177,670 A | 1/1993 | Shinohara et al. | |
| 5,271,150 A | 12/1993 | Inasaka | |

(Continued)

FOREIGN PATENT DOCUMENTS

EP        0359513        3/1990

(Continued)

OTHER PUBLICATIONS

Amey, D.I., et al., "Advances in MCM Ceramics", *Solid State Technology*, (1997), 143-146.

(Continued)

*Primary Examiner*—Tuan T. Dinh
(74) *Attorney, Agent, or Firm*—David L. Guglielmi

(57) ABSTRACT

To reduce switching noise, the power supply terminals of an integrated circuit die are coupled to the respective terminals of at least one capacitor embedded in an interposer that lies between the die and a substrate. In an embodiment, the interposer is a multilayer ceramic structure that couples power and signal conductors on the die to corresponding conductors on the substrate. The capacitor is formed of at least one high permittivity layer and in an embodiment comprises several high permittivity layers interleaved with conductive layers. Alternatively, the capacitor can comprise at least one embedded discrete capacitor. Also described are an electronic system, a data processing system, and various methods of manufacture.

10 Claims, 8 Drawing Sheets

U.S. PATENT DOCUMENTS

| | | | |
|---|---|---|---|
| 5,281,151 A | 1/1994 | Arima et al. | |
| 5,321,583 A | 6/1994 | McMahon | |
| 5,354,955 A | 10/1994 | Gregor et al. | |
| 5,377,139 A | 12/1994 | Lage et al. | |
| 5,469,324 A | 11/1995 | Henderson et al. | |
| 5,488,542 A | 1/1996 | Ito | |
| 5,639,989 A | 6/1997 | Higgins, III | |
| 5,691,568 A | 11/1997 | Chou et al. | |
| 5,714,801 A | 2/1998 | Yano et al. | |
| 5,736,448 A | 4/1998 | Saia et al. | |
| 5,745,335 A | 4/1998 | Watt | |
| 5,777,345 A | 7/1998 | Loder et al. | |
| 5,786,630 A | 7/1998 | Bhansali et al. | |
| 5,796,587 A | 8/1998 | Lauffer et al. | |
| 5,818,699 A | 10/1998 | Fukuoka | |
| 5,840,382 A | 11/1998 | Nishide et al. | |
| 5,867,148 A | 2/1999 | Kamimaki et al. | |
| 5,870,274 A | 2/1999 | Lucas | |
| 5,870,289 A | 2/1999 | Tokuda et al. | |
| 5,889,652 A | 3/1999 | Turturro | |
| 5,920,120 A | 7/1999 | Webb et al. | |
| 5,929,510 A | 7/1999 | Geller et al. | |
| 5,939,782 A | 8/1999 | Malladi | |
| 5,949,654 A | 9/1999 | Fukuoka | |
| 5,991,161 A | 11/1999 | Samaras et al. | |
| 6,061,228 A | 5/2000 | Palmer et al. | |
| 6,072,690 A | 6/2000 | Farooq et al. | |
| 6,075,427 A | 6/2000 | Tai et al. | |
| 6,088,915 A | 7/2000 | Turturro | |
| 6,097,609 A | 8/2000 | Kabadi | |
| 6,097,611 A | 8/2000 | Samaras et al. | |
| 6,104,599 A | 8/2000 | Ahiko et al. | |
| 6,183,669 B1 | 2/2001 | Kubota et al. | |
| 6,214,445 B1 | 4/2001 | Kanbe et al. | |
| 6,218,729 B1 | 4/2001 | Zavrel, Jr. et al. | |
| 6,252,761 B1 | 6/2001 | Branchevsky | |
| 6,369,443 B1 | 4/2002 | Baba | |
| 6,407,929 B1 | 6/2002 | Hale et al. | |
| 6,446,317 B1 | 9/2002 | Figueroa et al. | |
| 6,452,776 B1 | 9/2002 | Chakravorty | |
| 6,532,143 B2 | 3/2003 | Figueroa et al. | |
| 6,611,419 B1 | 8/2003 | Chakravorty | |
| 6,755,150 B2 | 6/2004 | Lai et al. | |
| 6,970,362 B1 | 11/2005 | Chakravorty | |
| 7,120,031 B2 | 10/2006 | Chakravorty et al. | |

FOREIGN PATENT DOCUMENTS

| | | |
|---|---|---|
| EP | 0656658 | 6/1995 |
| JP | 07-142867 | 6/1995 |
| JP | 08-172274 | 7/1996 |
| JP | 10-163447 | 6/1998 |
| WO | WO-97/50123 | 12/1997 |
| WO | WO-98/39784 | 9/1998 |
| WO | WO 00/21133 | 4/2000 |
| WO | WO-01/00573 | 1/2001 |
| WO | WO-0211206 A3 | 2/2002 |

OTHER PUBLICATIONS

Baniecki, J.D., et al., "Dielectric Relaxation of Ba0.7 Sr0.3 TiO3 Thin Films from 1 mHz to 20 GHz", *Appl. Phys. Letter 72(4)*, 1998 American Institue of Physics,(Jan. 1998), 198-500.

Chan, Y.C., et al., "Fabrication and Characterization of Multilayer Capacitors Buried in a Low Temperature Co-Fired Ceramic Substrate", *Active and Passive Elec. Comp.* vol. 20, (1998), 215-224.

Choi, Kwang L., et al., "Characterization of Embedded Passives Using Macromodels in LTCC Technology", *IEEE Transactions on Components, Packaging, and Manufacturing Technology*, vol. 21, (Aug. 1998), 258-268.

Eurskens, W., et al., "Design and Performance of UHF Band Inductors, Capacitors and Resonators Using LTCC Technology for Mobile Communication Systems", *1998 IEEE MTT—S Digest*, (1998), 1285-1288.

Koschmieder, Thomas, et al., "Ceramic Substrate Thickness, Test Board Thickness, and Part Spacing: A Screening Doe", *Proceedings of SMTA*.

*International Conference*, (Sep. 1999),6 pgs.

Mistler, Richard E., "Tape Casting: Past, Present, Potential", *The American Ceramic Society Bulletin*, (Oct. 1998),82-86.

Nishimura, T.B., et al., "3.5 V Operation Driver-Amplifier MMIC Utilizing SrTiO3 Capacitors for 1.95 GHz Wide-Band CDMA Cellular Phones", *1998 IEEE MTT-S Digest*, (1998),447-450.

Rector, Jr., John, et al., "Integrated and Integral Passive Components: A Technology Roadmap", *1997 Electronic Components and Technology Conference*, (1997),713-723.

Scrantom, Steve, et al., "Manufacture of Embedded Integrated Passive Components into Low Temperature Co-Fired Ceramic Systems", *1998 International Symposium on Microelectronics*, (1998),459-466.

Sugai, Kouichiro, et al., "Multilayer Alumina Substrates for ECU", *1998 IEEE/CPMT Berlin Int'l Electronics Manufacturing Technology Symposium*, (1998), 109-112.

Tok, Alfred I., et al., "Tape Casting of Composite Ceramic Substrates Using Hollow Micro-Speherical Powders", *Processing and Fabrication of Advanced Materials VII*, Proceedings of a Symposium organized by: The Minerals, Metals & Materials Society (TMS), Warrendale, PA, USA,(Oct. 1998),451-461.

Ueda, Tetsuzo, et al., "GaAś MMIC Chip-sets for Mobile Communication Systems with On-chip Ferroelectrics Capacitors", *Integrated Ferrelectrics*, vol. 7, (1995),45-60.

Williamson, III, William, et al., "High Frequency Dielectric Properties of PLZT Thin Films", *Integrated Ferrelectrics*, vol. 17, (1997),197-203.

Yamasaki, Kozo, et al., "Solder Column Interposer Grid Array—Improved CBGA Reliability", 1-9.

Yao, Kui, et al., "Improved Preparation Procedure and Properties for a Multilayer Piezoelectric Thick-Film Actuator", *Sensors and Actuators A 71*, (1998), 139-143.

ELECTRONIC ASSEMBLIES AND SYSTEMS COMPRISING INTERPOSER WITH EMBEDDED CAPACITORS

CONTINUATION APPLICATION

The present application is a continuation of application U.S. patent application Ser. No. 09/628,705, filed on Jul. 31, 2000, now issued as U.S. Pat. No. 6,970,362, which is incorporated herein by reference.

RELATED APPLICATION

The application is related to the following application which is assigned to the same assignee as the present application and which was filed on even date herewith:
U.S. patent application Ser. No. 09/631,037, entitled "Electronic Assembly Comprising Substrate with Embedded Capacitors", now issued as U.S. Pat. No. 6,611,419.

TECHNICAL FIELD

The application relates generally to electronics packaging. More particularly, the application relates to an electronic assembly that includes an interposer having one or more embedded capacitors to reduce switching noise in a high-speed integrated circuit, and to manufacturing methods related thereto.

BACKGROUND INFORMATION

Integrated circuits (ICs) are typically assembled into packages by physically and electrically coupling them to a substrate made of organic or ceramic material. One or more IC packages can be physically and electrically coupled to a printed circuit board (PCB) or card to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs on substrates, where each new generation of packaging must provide increased performance while generally being smaller or more compact in size.

An IC substrate may comprise a number of insulated metal layers selectively patterned to provide metal interconnect lines (referred to herein as "traces"), and one or more electronic components mounted on one or more surfaces of the substrate. The electronic component or components are functionally connected to other elements of an electronic system through a hierarchy of conductive paths that includes the substrate traces. The substrate traces typically carry signals that are transmitted between the electronic components, such as ICs, of the system. Some ICs have a relatively large number of input/output (I/O) terminals, as well as a large number of power and ground terminals. The large number of I/O, power, and ground terminals requires that the substrate contain a relatively large number of traces. Some substrates require multiple layers of traces to accommodate all of the system interconnections.

Traces located within different layers are typically connected electrically by vias (also called "plated through-holes") formed in the board. A via can be made by making a hole through some or all layers of a substrate and then plating the interior hole surface or filling the hole with an electrically conductive material, such as copper or tungsten.

One of the conventional methods for mounting an IC on a substrate is called "controlled collapse chip connect" (C4). In fabricating a C4 package, the electrically conductive terminations or lands (generally referred to as "electrical contacts") of an IC component are soldered directly to corresponding lands on the surface of the substrate using reflowable solder bumps or balls. The C4 process is widely used because of its robustness and simplicity.

As the internal circuitry of ICs, such as processors, operates at higher and higher clock frequencies, and as ICs operate at higher and higher power levels, switching noise can increase to unacceptable levels.

For the reasons stated above, and for other reasons stated below which will become apparent to those skilled in the art upon reading and understanding the present specification, there is a significant need in the art for a method and apparatus for packaging an IC on a substrate that minimizes problems, such as switching noise, associated with high clock frequencies and high power delivery.

DETAILED DESCRIPTION

In the following detailed description of embodiments of the invention, reference is made to the accompanying drawings that form a part hereof, and in which is shown by way of illustration specific preferred embodiments in which the inventive subject matter may be practiced. These embodiments are described in sufficient detail to enable those skilled in the art to practice the inventive subject matter, and it is to be understood that other embodiments may be utilized and that logical, mechanical and electrical changes may be made without departing from the spirit and scope of the present inventive subject matter. The following detailed description is, therefore, not to be taken in a limiting sense, and the scope of embodiments of the inventive subject matter is defined only by the appended claims.

The inventive subject matter provides a solution to power delivery problems that are associated with prior art packaging of integrated circuits that operate at high clock speeds and high power levels by embedding one or more decoupling capacitors in a multilayer structure. Various embodiments are illustrated and described herein. In an embodiment, the multilayer structure takes the form of an "interposer" between an IC die and a substrate to which the die would ordinarily have been directly mounted. The embedded capacitors can be discrete capacitors, or they can be one or more layers of capacitive material.

Figure 1:
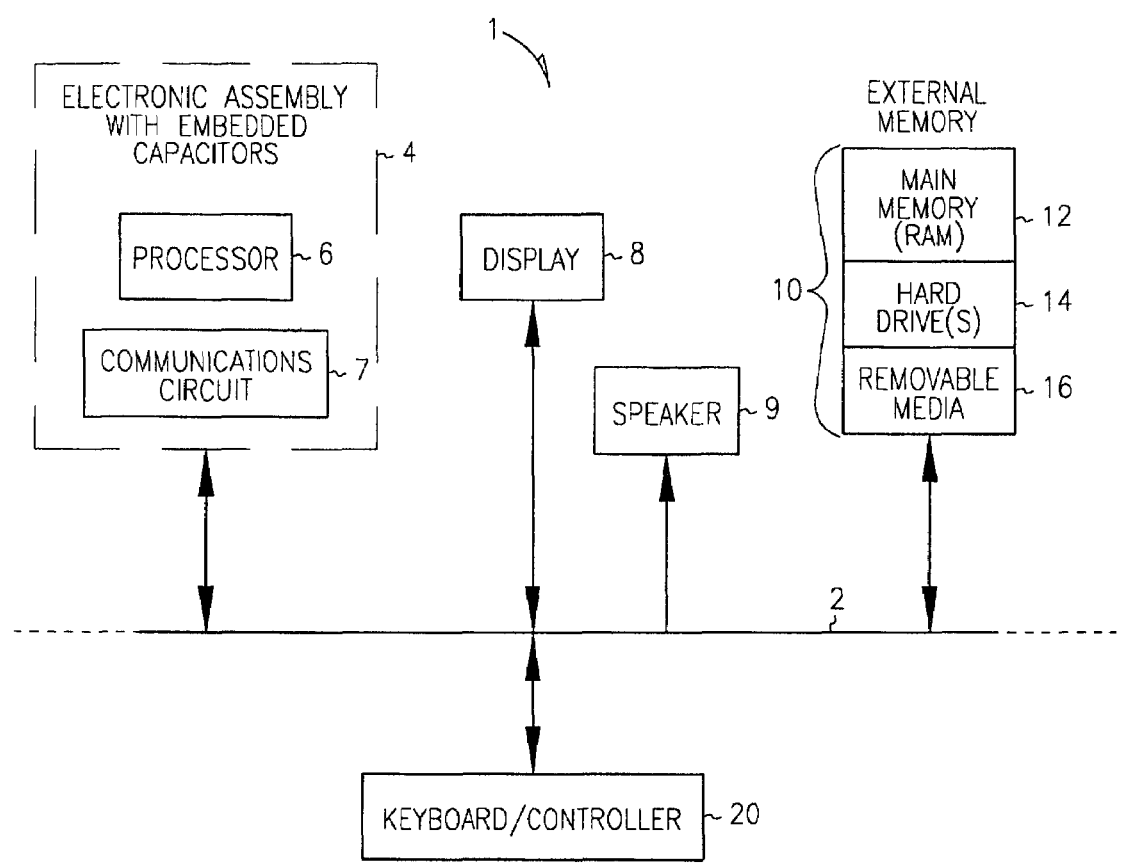
FIG. 1 is a block diagram of an electronic system incorporating at least one electronic assembly with embedded capacitors in accordance with an embodiment of the invention.

FIG. 1 is a block diagram of an electronic system 1 incorporating at least one electronic assembly 4 with embedded capacitors in accordance with an embodiment of the invention. Electronic system 1 is merely one example of an electronic system in which the inventive subject matter can be used. In this example, electronic system 1 comprises a data processing system that includes a system bus 2 to couple the various components of the system. System bus 2 provides communications links among the various components of the electronics system 1 and can be implemented as a single bus, as a combination of busses, or in any other suitable manner.

Electronic assembly 4 is coupled to system bus 2. Electronic assembly 4 can include any circuit or combination of circuits. In an embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that could be included in electronic assembly 4 are a custom circuit, an application-specific integrated circuit (ASIC), or the like, such as, for example, one or more circuits (such as communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a loudspeaker 9, and a keyboard and/or controller 20, which can include a mouse, trackball, game controller, voice-recognition device, or any other device that permits a system user to input information into and/or receive information from electronic system 1.

Figure 2:
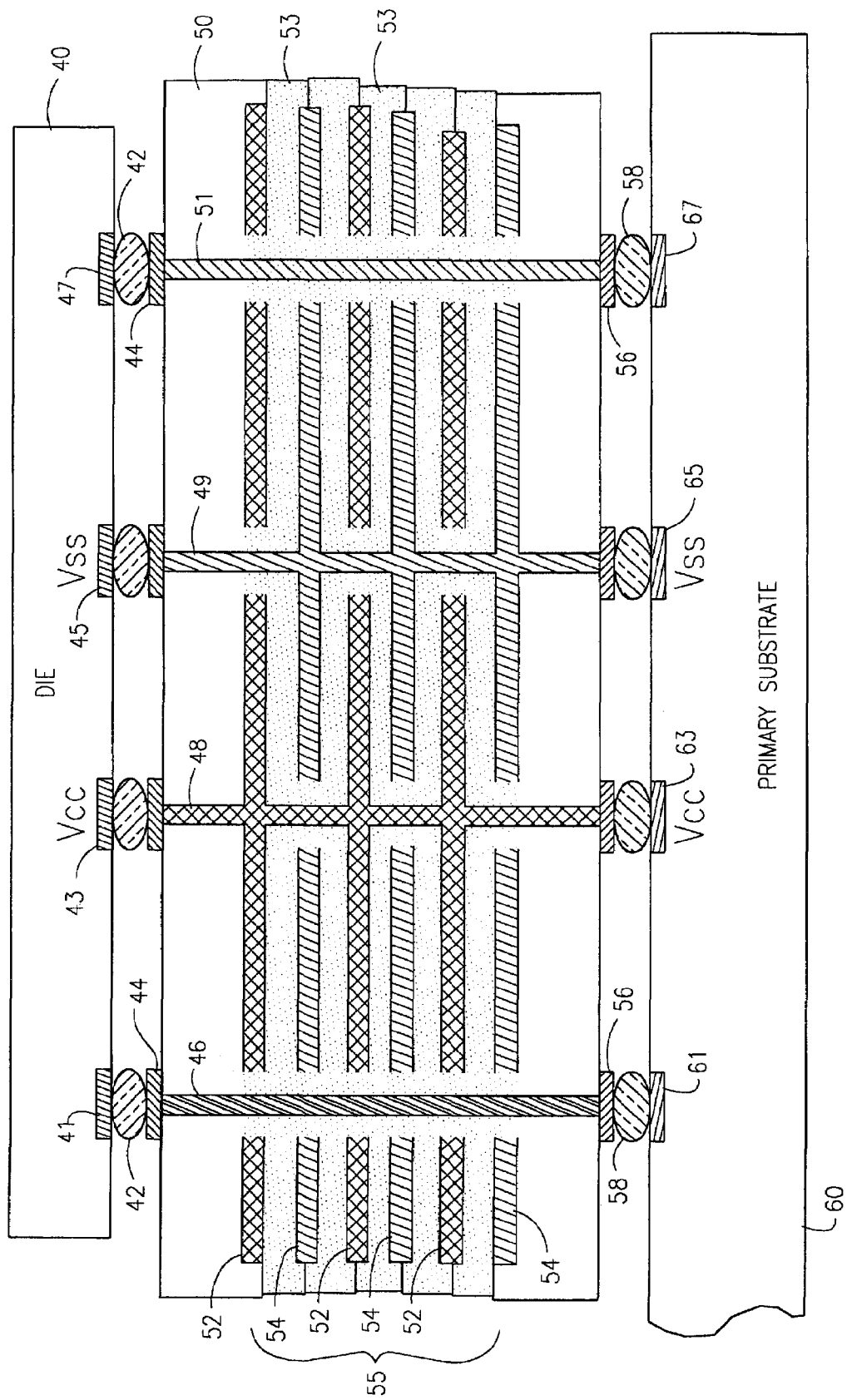
FIG. 2 shows a cross-sectional representation of a multilayer interposer in accordance with an embodiment of the invention.

FIG. 2 shows a cross-sectional representation of a multilayer interposer 50 in accordance with an embodiment of the invention. Interposer 50 is interposed between IC die 40 and primary substrate 60. IC die 40 can be of any type, such as a microprocessor or microcontroller, memory circuit, application specific integrated circuit (ASIC), digital signal processor (DSP), a radio frequency circuit, an amplifier, a power converter, a filter, a clocking circuit, and the like. Primary substrate 60 can be of any suitable type and can be made of any suitable material, e.g. an organic material, a polyimide, silicon, glass, quartz, ceramic, and the like.

Interposer 50 contains at least one embedded capacitor 55, comprising, in the embodiment shown, alternating pairs of capacitive plates 52 and 54 with high permittivity (Dk) layers 53 between them. The expression "high permittivity layer" as used herein means a layer of high permittivity material such as a high permittivity ceramic ply such as titanate particles; a high permittivity dielectric film such as a titanate film that is deposited, for example, by Sol-Gel or metal-organic chemical vapor deposition (MOCVD) techniques; or a layer of any other type of high permittivity material.

The Vcc and Vss electrodes of capacitor 55 of interposer 50, represented by reference numerals 52 and 54, respectively, can be coupled by metallized power vias 48 and 49, respectively, to the corresponding bumps 43 and 45, respectively, at the central or core region of the die and to corresponding bumps 63 and 65, respectively, on the primary substrate 60. If it is assumed, for the embodiment illustrated, that the via pitch is approximately 150 microns, a large number of such power vias (in excess of 2,000) can be accommodated, coupling capacitor 55 directly to the Vcc and Vss power nodes or bumps of IC die 40. This ensures a very low value for the loop inductance and enhances the current carrying capability of the overall IC packaging structure.

It will be understood that the land/bump pitch of the top of interposer 50 needs to match the bump pitch of die 40, and that the land/bump pitch of the bottom of interposer 50 needs to match the pad pitch of primary substrate 60. While in the embodiment shown in FIG. 2 the pitch is the same on the top and bottom of interposer 50, the pitch on the bottom of interposer 50 and on the primary substrate 60 could be relaxed to larger dimensions. That is, in an alternative embodiment the interposer 50 could be used to transform the pitch from a relatively tight die bump pitch to a relatively loose substrate pad pitch.

Signal bumps, such as signal bumps 41 and 47, are typically routed at the periphery of the die in an arrangement that is, for example, four or more rows deep (only one row being shown on each side of die 40 for the sake of simplicity). For peripheral signal bumps, interposer 50 may use through-vias (e.g. signal vias 46 and 51) which route signals from these signal bumps on the die to the opposite surface of interposer 50. Interposer 50 can eventually be coupled to the primary substrate 60, thus ensuring complete connectivity of the Vcc, Vss, and signal levels between the IC die 40 and the primary substrate 60.

The inventive subject matter is equally applicable to embodiments where signal traces occur other than at the periphery, and to embodiments where Vcc and Vss traces are provided anywhere on the die. Essentially, all signal I/O levels from signal I/O bumps on the IC die 40 can be coupled through interposer 50 to its opposite surface using through-vias like vias 46 and 51 shown in FIG. 2. Likewise, Vcc and Vss levels from corresponding bumps on the IC die 40 can be coupled through interposer 50 to its opposite surface using through-vias like 48 and 49, respectively.

Interposer 50 has a plurality of contacts or lands 44 on one surface that match corresponding solder balls or bumps 42, in terms of their pitch and placement, on a surface of IC die 40. In addition, interposer 50 has a plurality of contacts or lands 56 on another surface that match corresponding solder balls or bumps 58 on a surface of primary substrate 60. Die 40 and primary substrate 60 can be of any type. Although the embodiment of interposer 50 illustrated in FIG. 2 is described as having the same high density configuration of lands and vias as the IC die 40 an primary substrate 60, other embodiments could have a configuration of lands and vias of a different density. The through-vias can couple lands (e.g. lands 44 and 56) on opposite sides of the interposer 50 that have the same pitch, or the through-vias can be fanned out in order to relax the pitch of the lands on the lower surface of interposer 50.

When the IC package is assembled, the lands 44 of interposer 50 are coupled to solder bumps 42 on IC die 40, and the lands 56 of interposer 50 are coupled to solder bumps 58 on primary substrate 60.

At least one Vcc terminal 43 on die 40 is coupled to a via 48 of interposer 50 that couples Vcc potential to layers 52 of capacitor 55 and to Vcc terminal 63 of primary substrate 60. Also, at least one Vss terminal 45 on die 40 is coupled to a via 49 of interposer 50 that couples Vss potential to layers 54 of capacitor 55 and to Vss terminal 65 of primary substrate 60. In addition, at least one signal terminal 41 on die 40 is coupled to a through-via 46 that couples an IC signal level to a corresponding signal terminal 61 on primary substrate 60. An additional signal terminal 47 on die 40 is coupled to through-via 51 that couples an additional IC signal level to signal terminal 67 on primary substrate 60.

One important purpose of the interposer is to provide relatively high capacitance relatively close to the die in order to reduce the effect of reactive inductive coupling when the IC is operating, particularly at high clock speeds.

Figure 3:
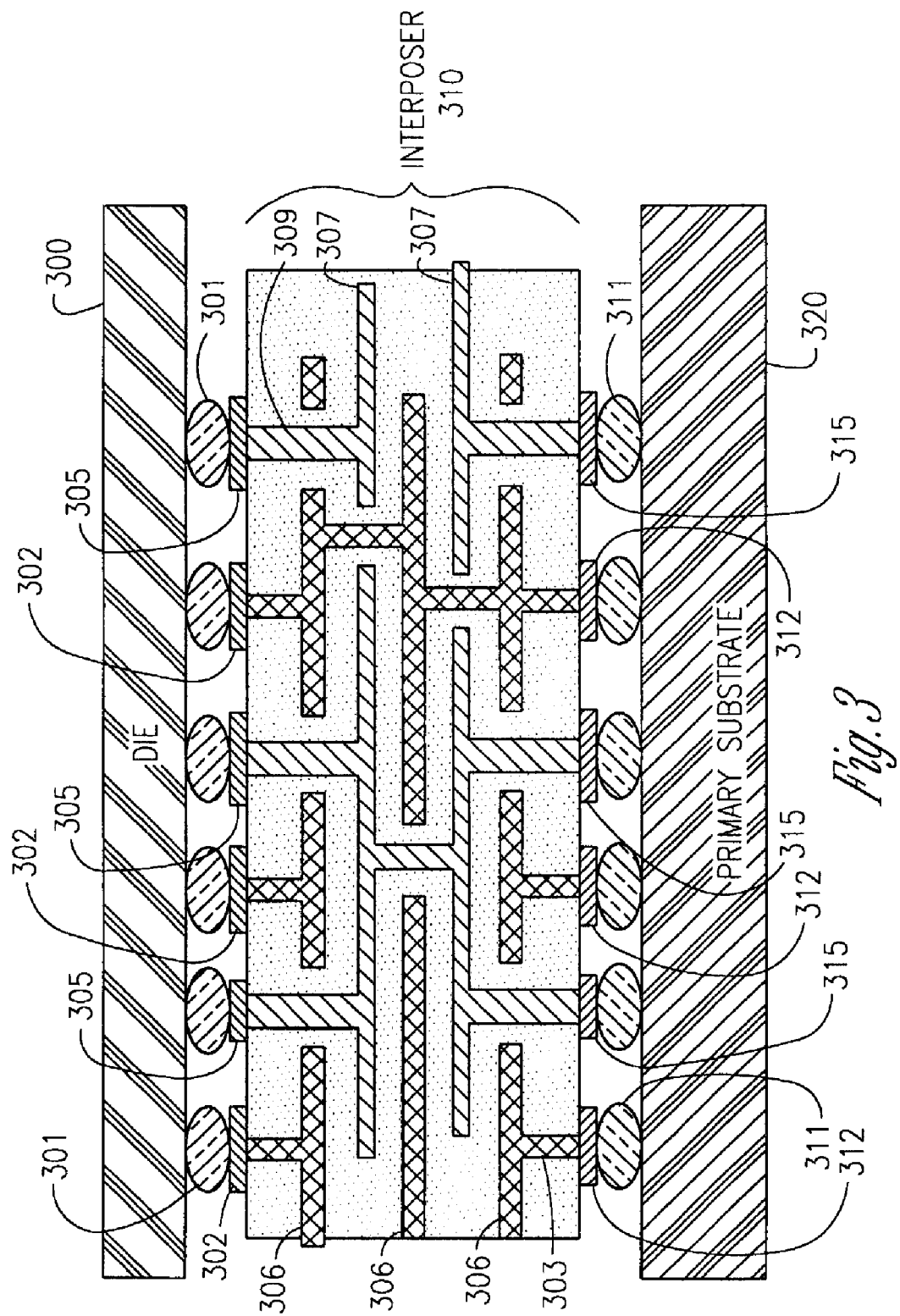
FIG. 3 shows a cross-sectional representation of a multilayer interposer with embedded capacitors in which the vias that couple capacitive layers of like potential are arranged throughout the interior of the interposer in accordance with an embodiment of the invention.

FIG. 3 shows a cross-sectional representation of a multilayer interposer 310 with embedded capacitors in which the vias that couple capacitive layers of like potential are arranged throughout the interior of the interposer in accordance with an embodiment of the invention. Interposer 310 can be coupled between IC die 300 and primary substrate 320. Interposer 310 can be coupled to IC die 300 by suitable connectors such as solder balls 301 on a matrix having the same pitch and location as corresponding conductive leads on IC die 300. Solder balls 301 can be affixed to lands 302 and 305 of interposer 310. Lands 302 are intended to be coupled to a Vcc potential, while lands 305 are intended to be coupled to a Vss potential. Lands 302 are coupled to capacitive plates 306, whereas lands 305 are coupled to capacitive plates 307.

Also coupled to capacitive plates 306 are lands 312 on another surface of interposer 310. Certain ones of solder balls 311 couple lands 312 to corresponding conductive traces or areas of primary substrate 320. In addition, lands 315 are coupled to capacitive plates 307 and to others of solder balls 311 that can be affixed to corresponding conductive traces or areas of primary substrate 320.

In this embodiment, the various capacitive plates 306 are coupled to lands 302 and 312, and they are further coupled to each other, by conductive vias such as via 303. Likewise, the various capacitive plates 307 are coupled to lands 305 and 315, and they are further coupled to each other, by conductive vias such as via 309. In this embodiment, vias that connect capacitive plates of the same potential are dispersed throughout any suitable part of the interior region of interposer ceramic substrate 310.

The interposer 310 comprises an embedded capacitor stack, the plates of which can be fabricated by using multiple layers or plys of ceramic film having a high permittivity (Dk) (i.e. having a dielectric constant greater than that of silicon dioxide). The Vcc and Vss connections are coupled to the plate electrodes of the embedded capacitor stack by connecting the respective lands to the plate electrode using metallized vias through the employment of conventional ceramic substrate technology.

Alternatively, the capacitor could also be fabricated by using a single layer or multiple layers of thin films which are deposited by techniques such as Sol-Gel, MOCVD, sputtering, or the like.

As described above, the Vcc and Vss bumps on the die can be connected to the electrodes of the capacitors by using metallized vias. The signal bumps (not illustrated in FIG. 3 but typically located at the peripheral regions of die 300) are routed to the opposing face of interposer 310 by using through-vias (although not shown in FIG. 3 they can be of the type illustrated in FIG. 2).

Figure 4:
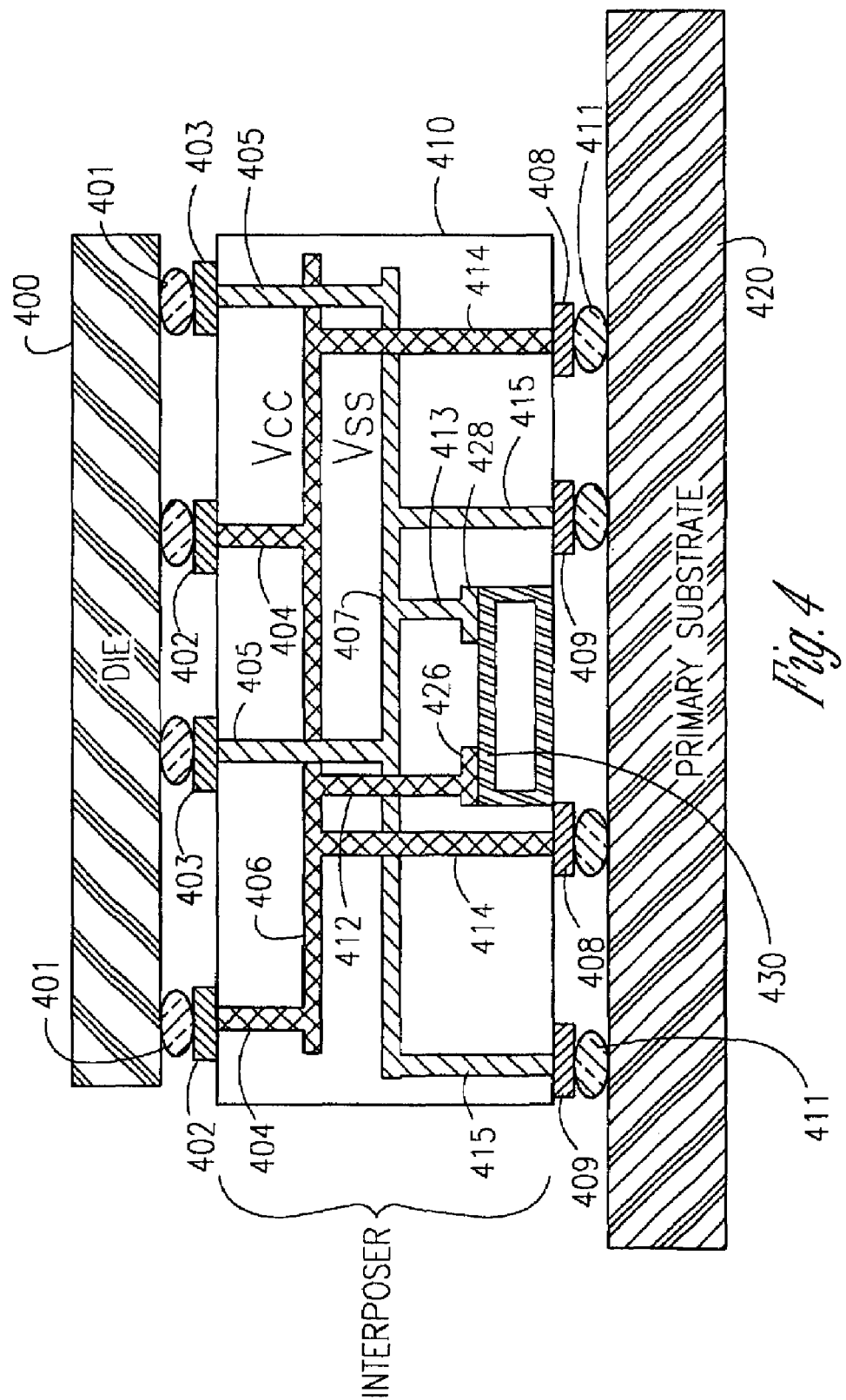
FIG. 4 shows a cross-sectional representation of a multilayer interposer with an embedded discrete capacitor in accordance with an alternate embodiment of the invention.

FIG. 4 shows a cross-sectional representation of a multilayer interposer 410 with an embedded discrete capacitor 430 in accordance with an alternate embodiment of the invention. Interposer 410 can be coupled between IC die 400 and primary substrate 420. Interposer 410 comprises an embedded discrete capacitor 430 having one terminal 426 intended to be coupled to Vcc potential and another terminal 428 intended to be coupled to Vss potential.

Lands 402 of interposer 410 are intended to be at Vcc potential and can be coupled via certain ones of solder balls 401 to corresponding conductive areas (not shown) on IC die 400. Likewise, lands 403 are intended to be at Vss potential and can be coupled via other solder balls 401 to corresponding areas (not shown) on IC die 400.

Lands 402 are coupled to one terminal 426 of embedded capacitor 430 by a route that includes vias 404, conductive layer 406, and via 412. Lands 402 are coupled to lands 408 by a similar routing that includes vias 414.

Lands 403 are coupled to another terminal 428 of embedded capacitor 430 by a route that includes vias 405, conductive layer 407, and via 413. Lands 403 are coupled to lands 409 by a similar routing that includes vias 415.

Lands 408 and 409 can be coupled to corresponding conductive leads or areas (not shown) on a surface of substrate 420 via solder bumps 411.

Various signal routing (not illustrated for the sake of simplicity, but comprising signal areas of IC die 400, certain solder balls 401, appropriate lands on interposer 410, and signal planes and vias within interposer 410) can also be provided within interposer 410, as will be understood by those of ordinary skill.

Embedded capacitor 430 can be of any suitable type. In an embodiment, it is a ceramic chip capacitor that is fabricated using conventional ceramic chip capacitor technology. While a single capacitor 430 is illustrated, for the sake of simplicity of illustration and description, multiple capacitors could be used in the embodiment illustrated in FIG. 4.

Figure 5:
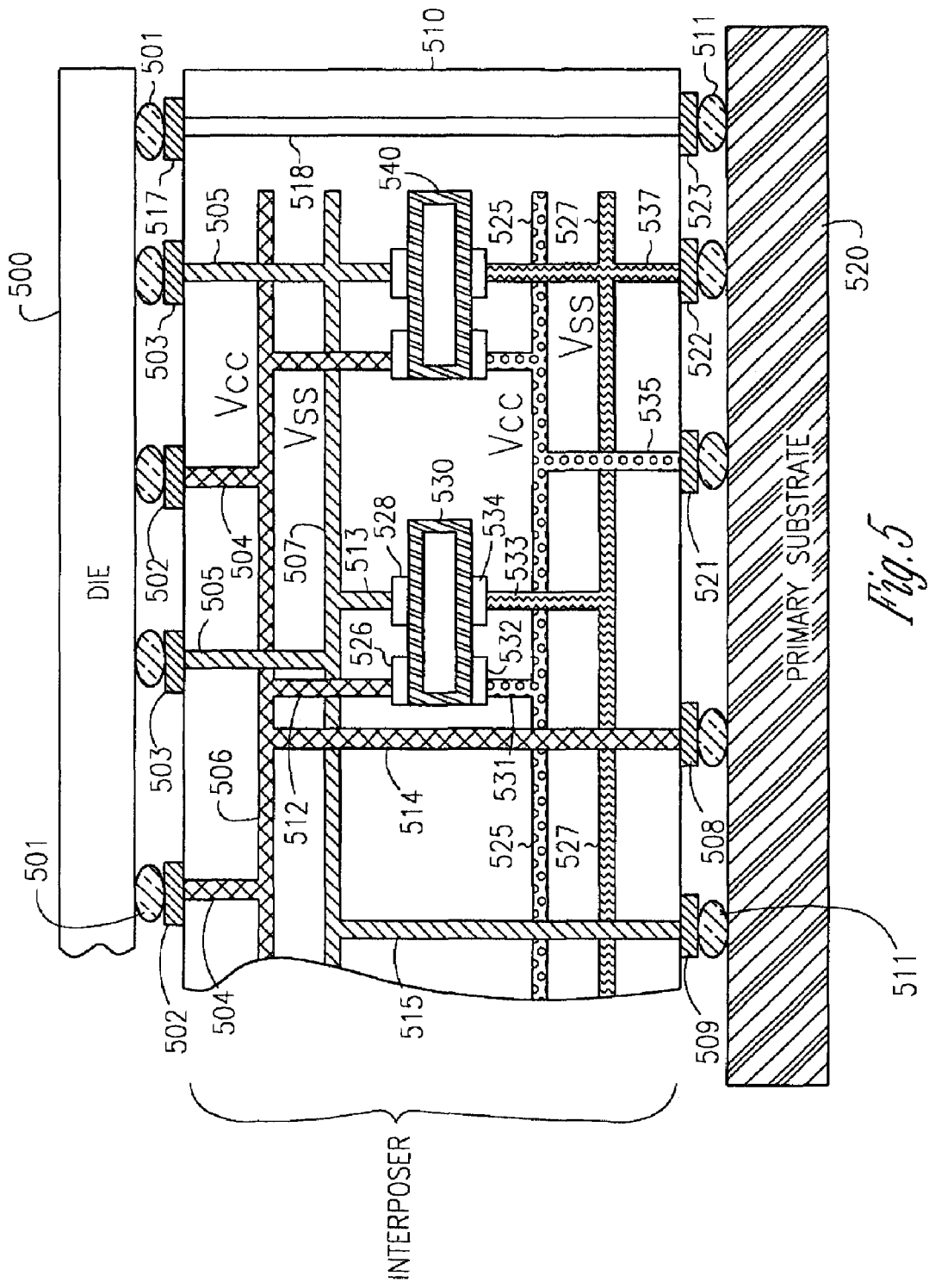
FIG. 5 shows a cross-sectional representation of a multilayer interposer with two embedded discrete capacitors in accordance with an alternate embodiment of the invention

FIG. 5 shows a cross-sectional representation of a multilayer interposer 510 with two embedded discrete capacitors 530 and 540 in accordance with an alternate embodiment of the invention. Interposer 510 can be coupled between IC die 500 and primary substrate 520.

Embedded discrete capacitor 530 has terminals 526 and 532 intended to be coupled to Vcc potential, and it further has terminals 528 and 534 intended to be coupled to Vss potential.

Lands 502 of interposer 510 are intended to be at Vcc potential and can be coupled via certain ones of solder balls 501 to corresponding conductive areas (not shown) on IC die 500. Likewise, lands 503 are intended to be at Vss potential and can be coupled via other solder balls 501 to corresponding areas (not shown) on IC die 500.

Lands 502 are coupled to one terminal 526 of embedded capacitor 530 by a route that includes vias 504, conductive layer 506, and via 512. Lands 502 are coupled to land 508 by a similar routing that includes via 514.

Lands 503 are coupled to another terminal 528 of embedded capacitor 530 by a route that includes vias 505, conductive layer 507, and via 513. Lands 503 are coupled to land 509 by a similar routing that includes via 515.

Lands 508 and 509 can be coupled to corresponding conductive leads or areas (not shown) on a surface of substrate 520 via solder bumps 511.

Discrete capacitor also has two lower terminals 532 and 534. Terminal 532 is coupled to Vcc on the primary substrate 520 by a routing that includes via 531, conductive layer 525, via 535, land 521, and one of solder bumps 511. Likewise, terminal 534 is coupled to Vss on the primary substrate 520 by a routing that includes via 533, conductive layer 525, via 537, land 522, and one of solder bumps 511.

Various signal routing comprising signal areas of IC die 500 (not illustrated for the sake of simplicity), certain solder balls 501, appropriate lands on interposer 510 such as land 517, and signal planes and vias within interposer 510 such as via 518 can also be provided within interposer 510, as will be understood by those of ordinary skill.

Embedded capacitors 530 and 540 can be of any suitable type. In an embodiment, they are ceramic chip capacitors that are fabricated using conventional ceramic chip capacitor technology. While two capacitors 530 and 540 are illustrated, for the sake of simplicity of illustration and description, a different number of capacitors could be used in the embodiment illustrated in FIG. 5, including only one capacitor.

FIGS. 2-5 are merely representational and are not drawn to scale. Certain proportions thereof may be exaggerated, while others may be minimized. FIGS. 2-5 are intended to illustrate various implementations of the inventive subject matter, which can be understood and appropriately carried out by those of ordinary skill in the art.

Fabrication

Multilayer interposers (e.g. interposer 50, FIG. 2) can be fabricated by conventional techniques, such as but not limited to high temperature co-fired ceramic (HTCC) technology, high thermal coefficient of expansion (HITCE) technology, or glass ceramic technology.

Although it is known in ceramic technology to embed low Dk capacitors in ceramic substrates, by sandwiching thin (e.g. 2 mils) films of conventional ceramic such as $Al_2O_3$ between metal planes, in embodiments of the present invention multilayer stacks of high Dk ply are used in an embodiment. High Dk ply is commercially available for fabricating ceramic chip capacitors, for example. Suitable high Dk materials, such as titanate particles, can be inserted into the conventional ceramic matrix. Multilayer stacks of high Dk ply, such as $BaTiO_3$, in embodiments of the present invention can provide capacitances as high as 10 μF/sq. cm., compared to capacitances in the range of only nano-Farads/sq. cm. for low Dk ply.

In an alternative embodiment, a high Dk layer, such as a titanate film, e.g. $(Ba_xSr_{1-x})TiO_3$ (BST) or $PbZrTiO_3$ (PZT) or $Ta_2O_5$ or $SrTiO_3$, can be formed in the ceramic substrate by known techniques such as a metal-organic chemical vapor deposition (MOCVD) process, or a Sol-Gel process, in which a sol (i.e., a colloidal suspension of solid particles in a liquid) transforms into a gel due to growth and interconnection of solid particles.

In either case, high Dk material can be embedded at temperature ranges that are compatible with ceramic technology (e.g. 600-1000 degrees Centigrade).

Regarding the embodiments illustrated in FIGS. 4 and. 5, wherein one or more discrete capacitors are embedded in the interposer, access to the capacitor(s) can be made by any conventional technique, such as punching or laser ablation, and the Vcc and Vss conductors of the interposer can be coupled to the appropriate terminals of the capacitor(s) by any suitable metallization technique that is consistent with the temperature requirements of the process.

Estimation of Capacitance

Capacitance values for the embodiment shown in FIG. 2 can be estimated via Equation 1.

$$C = A * \in_r * \in_0 / d \qquad \text{Equation (1)}$$

where:
A=capacitor size (square meters)
$\in_r$=permittivity constant $8.854 \times 10^{12}$ Farads/meter
$\in^0$=dielectric constant of insulator
d=dielectric layer thickness (meters)

Figure 6:
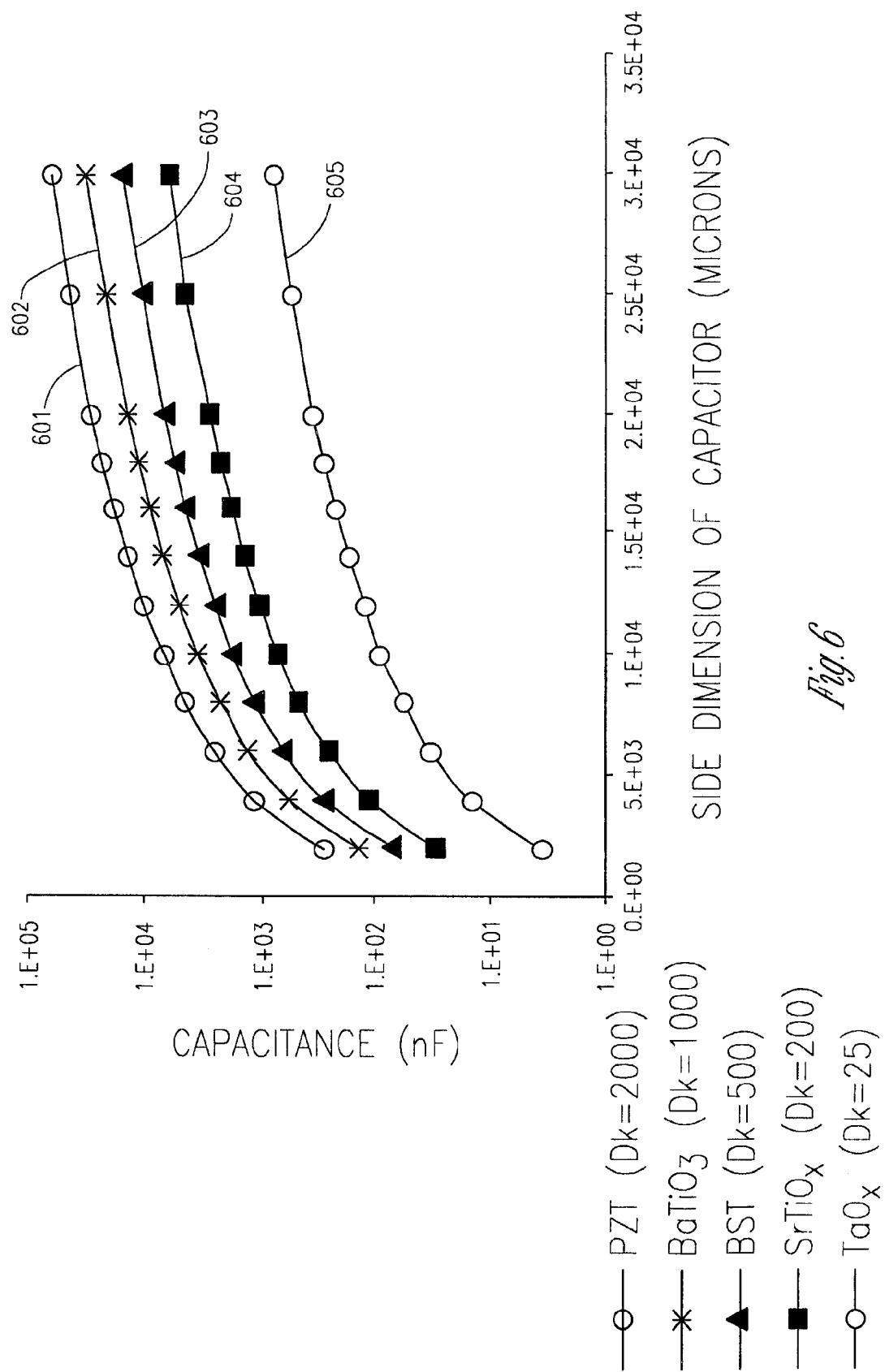
FIG. 6 shows a graphical representation of capacitance versus area for various dielectric materials that can be used in an interposer with an embedded capacitor in accordance with an embodiment of the invention.

FIG. 6 shows a graphical representation of capacitance (in nano-Farads) versus a side dimension of the capacitor (in microns) for various dielectric materials that can be used in an interposer with an embedded capacitor in accordance with an embodiment of the invention. Shown in FIG. 6 are plots for the following dielectric materials: line 601 for PZT (Dk=2000), line 602 for $BaTiO_3$ (Dk=1000), line 603 for BST (Dk=500), line 604 for $SrTiO_x$ (Dk=200), and line 605 for $TaO_x$ (Dk=25).

FIG. 6 summarizes the approximate range of capacitance available with the various titanates and oxide materials indicated. When using high permittivity ceramic ply (such as $BaTiO_3$ impregnated ceramic ply), the indicated values correspond to the maximum capacitance generally achievable with a 10 micron thick ply between Vcc and Vss layers in a stack containing 40 such layers.

In the case of a dielectric formed by Sol-Gel or MOCVD embodiments (e.g., PZT, BST, $SrTiO_3$, or $Ta_2O_5$), the computed values correspond to a 0.25 micron film of the indicated dielectric.

To satisfy the capacitance requirements of any given embodiment, multiple layers of capacitors could be stacked as necessary.

Figure 7:
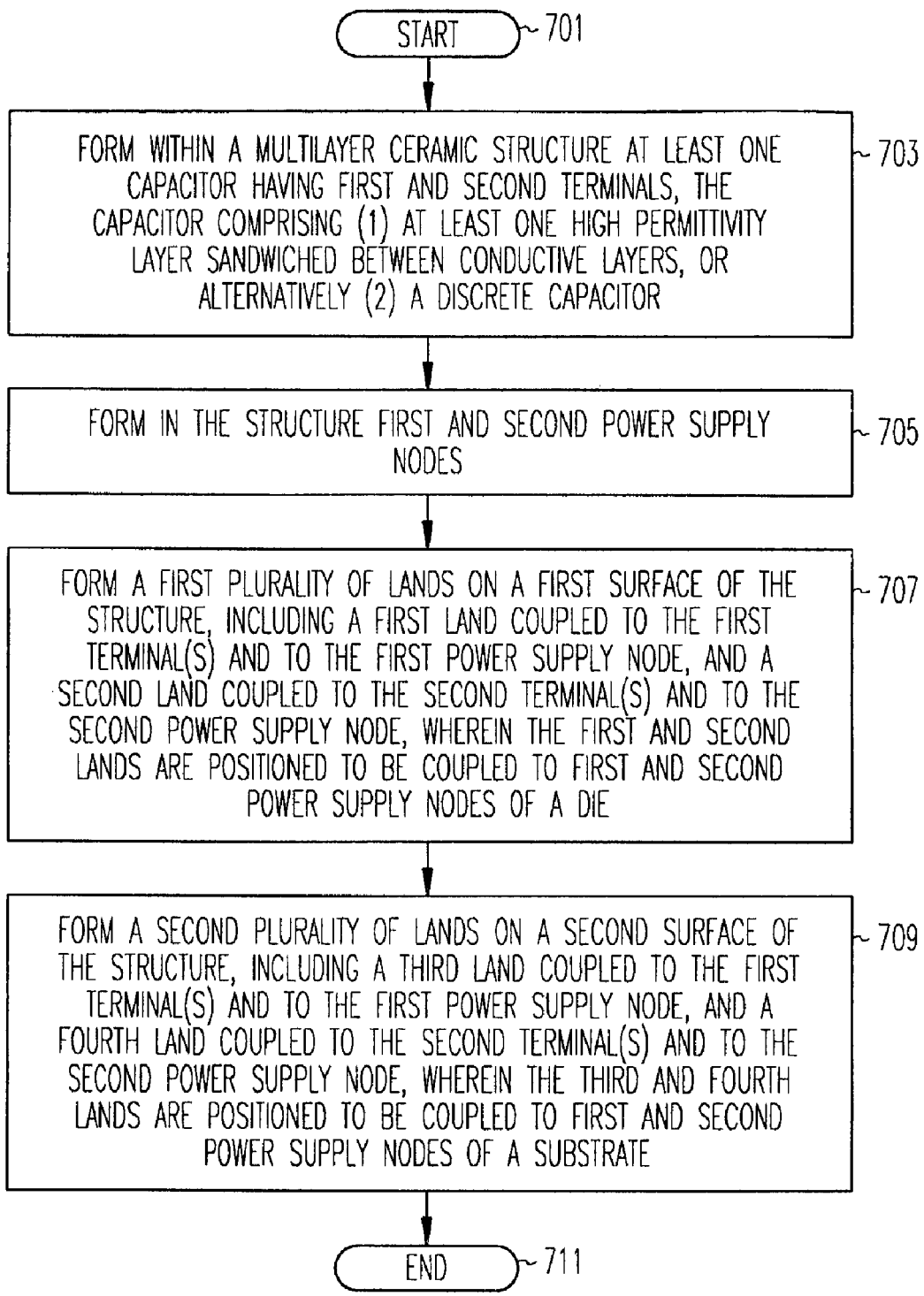
FIG. 7 is a flow diagram of a method of fabricating an interposer comprising an embedded capacitor, in accordance with an embodiment of the invention.

FIG. 7 is a flow diagram of a method of fabricating an interposer comprising an embedded capacitor, in accordance with an embodiment of the invention. The method begins at 701.

In 703, at least one capacitor having first and second terminals is formed within a structure. In an embodiment, the structure is a multilayer ceramic structure, although in other embodiments the structure could be formed of a material other than a ceramic material. The capacitor comprises (1) at least one high permittivity layer sandwiched between conductive layers; alternatively, the capacitor is (2) a discrete capacitor.

In 705, first and second power supply nodes are formed in the structure. As used herein, the term "power supply node"

refers to either a ground node (e.g. Vss) or to a power node at a potential different from ground (e.g. Vcc).

In 707, a first plurality of lands are formed on a first surface of the structure, including a first land coupled to the first terminal(s) of the capacitor(s) and to the first power supply node, and a second land coupled to the second terminal(s) of the capacitor(s) and to the second power supply node. The first and second lands are positioned to be coupled to first and second power supply nodes of a die (e.g. IC die 40, FIG. 2) that is to be juxtaposed to the first surface of the structure.

In 709, a second plurality of lands are formed on a second surface of the structure, including a third land coupled to the first terminal(s) of the capacitor(s) and to the first power supply node, and a fourth land coupled to the second terminal(s) of the capacitor(s) and to the second power supply node. The third and fourth lands are positioned to be coupled to first and second power supply nodes of a substrate (e.g. substrate 60, FIG. 2) that is to be juxtaposed to the second surface of the structure. The method ends at 711.

Figure 8:
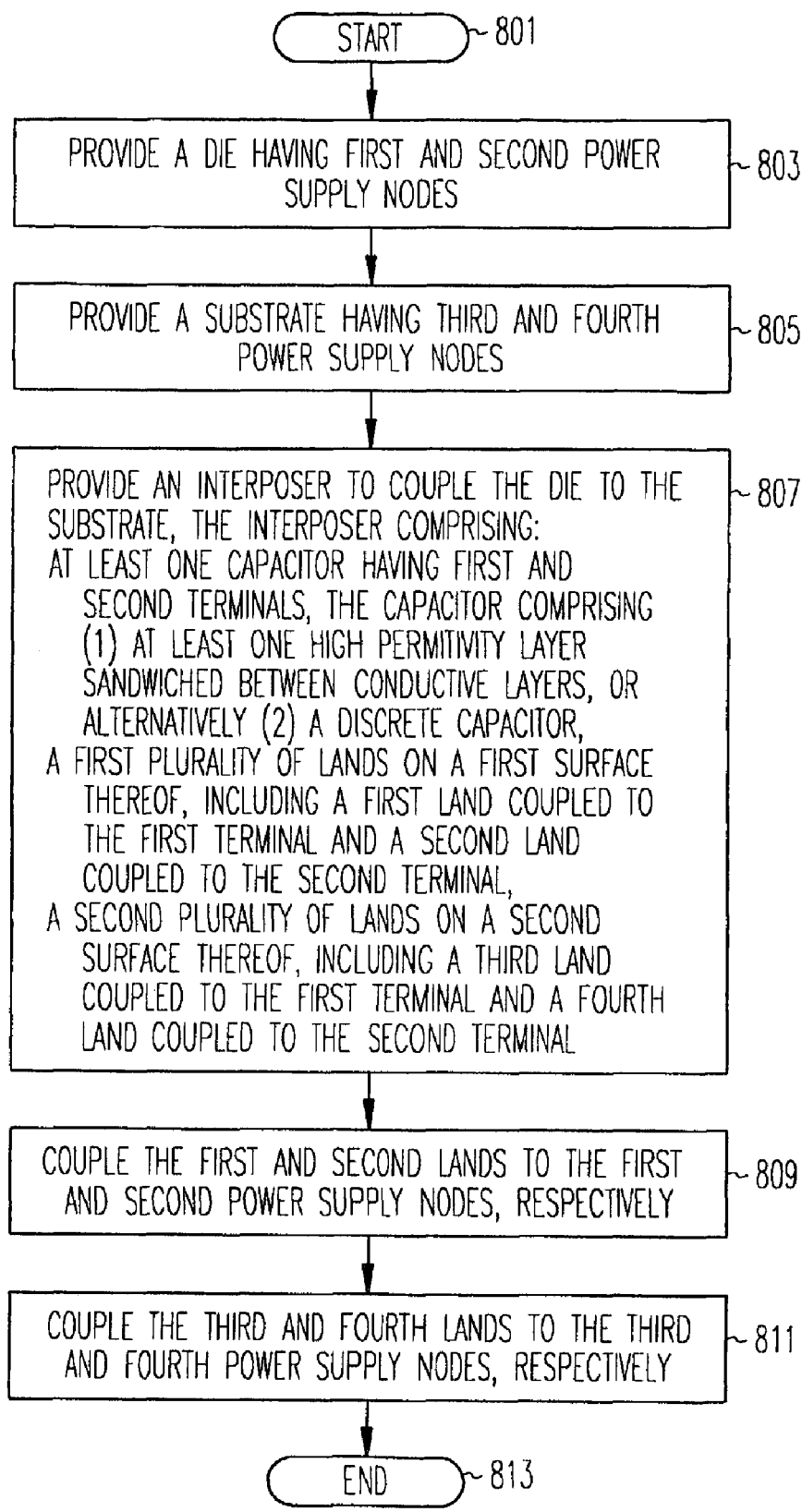
FIG. 8 is a flow diagram of a method of fabricating an electronic assembly having an interposer comprising an embedded capacitor, in accordance with an embodiment of the invention.

FIG. 8 is a flow diagram of a method of fabricating an electronic assembly having an interposer comprising an embedded capacitor, in accordance with an embodiment of the invention. The method begins at 801.

In 803, a die is provided that has first and second power supply nodes.

In 805, a substrate is provided that has third and fourth power supply nodes.

In 807, an interposer is provided to couple the die to the substrate. The interposer comprises at least one capacitor having first and second terminals. The capacitor comprises (1) at least one high permittivity layer sandwiched between conductive layers; alternatively, the capacitor is a discrete capacitor. The interposer further comprises a first plurality of lands on a first surface thereof, including a first land coupled to the first terminal(s) of the capacitor(s) and a second land coupled to the second terminal(s) of the capacitor(s). The interposer also comprises a second plurality of lands on a second surface thereof, including a third land coupled to the first terminal(s) and a fourth land coupled to the second terminal(s).

In 809, the first and second lands are coupled to the first and second power supply nodes, respectively, of the die.

In 811, the third and fourth lands are coupled to the third and fourth power supply nodes, respectively, of the substrate.

The operations described above with respect to the methods illustrated in FIGS. 7 and 8 can be performed in a different order from those described herein.

Embodiments of the inventive subject matter provide for an electronic assembly and methods of manufacture thereof that minimize problems, such as switching noise, associated with high clock frequencies and high power delivery. Embodiments of the inventive subject matter provide scalable high capacitance (e.g. >10 mF/square centimeter) by employing embedded decoupling capacitors having low inductance that can satisfy the power delivery requirements of, for example, high performance processors. An electronic system that incorporates the inventive subject matter can operate at higher clock frequencies and is therefore more commercially attractive.

As shown herein, the inventive subject matter can be implemented in a number of different embodiments, including an interposer, an electronic assembly, an electronic system, a data processing system, a method for making an interposer, and a method of making an electronic assembly. Other embodiments will be readily apparent to those of ordinary skill in the art. The capacitive elements, choice of materials, geometries, and capacitances can all be varied to suit particular packaging requirements. The particular geometry of the embedded capacitors is very flexible in terms of their orientation, size, number, location, and composition of their constituent elements.

While embodiments have been shown in which signal traces are provided around the periphery, and in which Vcc and Vss traces are provided at the die core, the inventive subject matter is equally applicable to embodiments where the signal traces occur other than at the periphery, and to embodiments where Vcc and Vss traces are provided anywhere on the die.

Further, the inventive subject matter is not to be construed as limited to use in C4 packages, and it can be used with any other type of IC package where the herein-described features of the inventive subject matter provide an advantage.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the inventive subject matter. Therefore, it is manifestly intended that embodiments of this invention be limited only by the claims and the equivalents thereof.

What is claimed is:

1. An interposer to couple a die to a substrate and comprising:
   a plurality of power and ground vias in a core region of the interposer;
   an embedded capacitor having first and second terminals;
   a first surface including a first plurality of power lands coupled to the first terminal through first ones of the plurality of power vias, and a first plurality of ground lands coupled to the second terminal through first ones of the plurality of ground vias;
   a second surface including a second plurality of power lands coupled to the first terminal through second ones of the plurality of power vias, and a second plurality of ground lands coupled to the second terminal through second ones of the plurality of ground vias;
   wherein the first plurality of power lands and the first plurality of ground lands are positioned to be coupled to corresponding power and ground nodes of the die through controlled collapse chip connect solder bumps;
   a plurality of signal vias in a peripheral region of the interposer;
   wherein the first surface comprises a first plurality of signal lands coupled to the plurality of signal vias and positioned to be coupled to corresponding signal nodes of the die; and
   wherein the second surface comprises a second plurality of signal lands coupled to the plurality of signal vias and positioned to be coupled to corresponding signal nodes of the substrate.

2. The interposer recited in claim 1, wherein the interposer comprises a multilayer ceramic structure.

3. The interposer recited in claim 1, wherein at least one of the power vias does not go entirely through the interposer.

4. The interposer recited in claim 1, wherein at least one of the ground vias does not go entirely through the interposer.

5. The interposer recited in claim 1, wherein the plurality of power and ground vias is a relatively large number.

6. An interposer to couple a die to a substrate and comprising:

a plurality of power and ground vias in a core region of the interposer;

a pair of embedded capacitors each having a first terminal and a second terminal;

a first surface including a first plurality of power lands coupled to the first terminals through the plurality of power vias, and a first plurality of ground lands coupled to the second terminals through the plurality of ground vias;

a second surface including a second plurality of power lands coupled to the first terminals through the plurality of power vias, and a second plurality of ground lands coupled to the second terminals through the plurality of ground vias;

wherein the first plurality of power lands and the first plurality of ground lands are positioned to be coupled to corresponding power and ground nodes of the die through controlled collapse chip connect solder bumps;

a plurality of signal vias in a peripheral region of the interposer;

wherein the first surface comprises a first plurality of signal lands coupled to the plurality of signal vias and positioned to be coupled to corresponding signal nodes of the die; and wherein the second surface comprises a second plurality of signal lands coupled to the plurality of signal vias and positioned to be coupled to corresponding signal nodes of the substrate.

7. The interposer recited in claim 6, wherein the interposer comprises a multilayer ceramic structure.

8. The interposer recited in claim 6, wherein at least one of the power vias does not go entirely through the interposer.

9. The interposer recited in claim 6, wherein at least one of the ground vias does not go entirely through the interposer.

10. The interposer recited in claim 6, wherein the plurality of power and ground vias is a relatively large number.

* * * * *